(12) United States Patent
Lee et al.

(10) Patent No.: US 9,424,990 B2
(45) Date of Patent: Aug. 23, 2016

(54) MULTILAYERED CERAMIC CAPACITOR AND BOARD FOR MOUNTING THE SAME

(71) Applicant: SAMSUNG ELECTRO-MECHANICS CO., LTD., Suwon-Si, Gyeonggi-Do (KR)

(72) Inventors: Jong Ho Lee, Suwon-Si (KR); Jae Yeol Choi, Suwon-Si (KR); Sang Huk Kim, Suwon-Si (KR); Myung Jun Park, Suwon-Si (KR); Yu Na Kim, Suwon-Si (KR); Sung Woo Kim, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/230,688

(22) Filed: Mar. 31, 2014

(65) Prior Publication Data

US 2014/0345926 A1    Nov. 27, 2014

(30) Foreign Application Priority Data

May 21, 2013 (KR) .................. 10-2013-0057202

(51) Int. Cl.
*H01G 4/30* (2006.01)
*H05K 1/18* (2006.01)
(Continued)

(52) U.S. Cl.
CPC . *H01G 4/30* (2013.01); *H01G 4/12* (2013.01); *H01G 4/232* (2013.01); *H05K 1/181* (2013.01)

(58) Field of Classification Search
CPC .............................................. H01G 4/00–4/40
USPC ................................................... 361/271–330
See application file for complete search history.

(56) References Cited

U.S. PATENT DOCUMENTS 1,924,435 A * 8/1933 Homer ................ H01G 2/12
                                                          264/261
4,513,350 A    4/1985 Coleman
(Continued)

FOREIGN PATENT DOCUMENTS

JP    10-289837 A    10/1998
JP    2009-021512 A    1/2009
(Continued)

OTHER PUBLICATIONS

Notice of Office Action Korean Patent Application No. 10-2013-0057202 dated Jun. 24, 2014 with English translation.
(Continued)

*Primary Examiner* — Jeremy C Norris
*Assistant Examiner* — Muhammed Azam
(74) *Attorney, Agent, or Firm* — McDermott Will & Emery LLP

(57) ABSTRACT

A multilayered ceramic capacitor including a ceramic body including a dielectric layer and having first and second main surfaces, first and second end surfaces, and first and second side surfaces; a first internal electrode having a first lead part; a second internal electrode having a second lead part; a first external electrode electrically connected to the first lead part and extending from the side surface having the first lead part exposed thereto, to at least one of the first and second main surfaces; a second external electrode electrically connected to the second lead part and extending from the side surface having the second lead part exposed thereto, to at least one of the first and second main surfaces; and an insulating layer covering the first and second external electrodes disposed on the first and second side surfaces.

31 Claims, 15 Drawing Sheets

(51) Int. Cl.
*H01G 4/12* (2006.01)
*H01G 4/232* (2006.01)

(56) References Cited

U.S. PATENT DOCUMENTS

| | | | | |
|---|---|---|---|---|
| 4,785,990 A | * | 11/1988 | Nakahara et al. | 228/170 |
| 5,144,528 A | * | 9/1992 | Watanabe et al. | 361/321.1 |
| 5,985,414 A | * | 11/1999 | Fukuda et al. | 428/192 |
| 6,208,501 B1 | * | 3/2001 | Ingalls et al. | 361/303 |
| 6,243,252 B1 | * | 6/2001 | Kuroiwa et al. | 361/303 |
| 6,373,673 B1 | * | 4/2002 | Anthony | 361/117 |
| 6,515,842 B1 | * | 2/2003 | Hayworth et al. | 361/303 |
| 7,355,835 B2 | * | 4/2008 | Saitou | H01G 9/012 361/301.4 |
| 7,446,996 B2 | * | 11/2008 | Togashi | 361/303 |
| 7,843,679 B2 | * | 11/2010 | Togashi | 361/303 |
| 8,064,189 B2 | * | 11/2011 | Masuda | H01G 4/005 361/303 |
| 2002/0017700 A1 | * | 2/2002 | Mori et al. | 257/532 |
| 2004/0266087 A1 | * | 12/2004 | Greier et al. | 438/202 |
| 2007/0096524 A1 | * | 5/2007 | Chou | 297/313 |
| 2007/0165360 A1 | | 7/2007 | Randall et al. | |
| 2007/0297119 A1 | * | 12/2007 | Maegawa et al. | 361/306.3 |
| 2008/0310076 A1 | | 12/2008 | Ritter et al. | |
| 2009/0116168 A1 | * | 5/2009 | Block et al. | 361/306.3 |
| 2010/0182732 A1 | * | 7/2010 | Togashi | 361/303 |
| 2011/0002082 A1 | * | 1/2011 | Bultitude | H01G 4/005 361/306.3 |
| 2011/0267736 A1 | * | 11/2011 | Sasabayashi et al. | 361/301.1 |
| 2012/0018844 A1 | * | 1/2012 | Hafezi | 257/532 |
| 2012/0075766 A1 | * | 3/2012 | Nishioka et al. | 361/301.4 |
| 2012/0229948 A1 | * | 9/2012 | Sawyer | H01G 4/32 361/301.1 |
| 2012/0229952 A1 | * | 9/2012 | Kim | H01G 4/005 361/321.2 |
| 2013/0020905 A1 | | 1/2013 | Sawada et al. | |
| 2013/0050893 A1 | | 2/2013 | Kim | |
| 2013/0050897 A1 | | 2/2013 | Kim | |
| 2013/0057112 A1 | | 3/2013 | Shirakawa et al. | |
| 2014/0160617 A1 | * | 6/2014 | Kim | H01G 4/00 361/301.4 |
| 2014/0345925 A1 | * | 11/2014 | Lee | H01G 4/30 174/260 |
| 2015/0041193 A1 | * | 2/2015 | Lee | H01G 4/12 174/258 |
| 2016/0020032 A1 | * | 1/2016 | Shin | H01G 4/38 174/260 |
| 2016/0020041 A1 | * | 1/2016 | Ahn | H01G 15/00 363/21.01 |

FOREIGN PATENT DOCUMENTS

| | | |
|---|---|---|
| JP | 2009-026872 A | 2/2009 |
| JP | 2012-227491 A | 11/2012 |
| JP | 2013-046051 A | 3/2013 |
| JP | 2013-058558 A | 3/2013 |
| KR | 10-2012-0085192 A | 7/2012 |
| KR | 10-2013-0022825 A | 3/2013 |
| KR | 10-2013-0024531 A | 3/2013 |

OTHER PUBLICATIONS

European Search Report issued in European Application No. 13275176.9-1808 dated Oct. 6, 2014.

* cited by examiner

MULTILAYERED CERAMIC CAPACITOR AND BOARD FOR MOUNTING THE SAME

CROSS-REFERENCE TO RELATED APPLICATION

This application claims the priority to Korean Patent Application No. 10-2013-0057202 filed on May 21, 2013, in the Korean Intellectual Property Office, the disclosure of which is incorporated herein by reference.

BACKGROUND

1. Field of the Invention

The present disclosure relates to a multilayered ceramic capacitor and a board for mounting the same.

2. Description of the Related Art

Generally, electronic components using a ceramic material, such as a capacitor, an inductor, a piezoelectric element, a varistor, a thermistor, or the like, include a ceramic body formed of a ceramic material, internal electrodes formed in the ceramic body, and external electrodes mounted on a surface of the ceramic body and connected to the internal electrodes.

Among the ceramic electronic components, a multilayered ceramic capacitor includes a plurality of multilayered dielectric layers, internal electrodes disposed to face each other, having the dielectric layer therebetween, and external electrodes electrically connected to the internal electrodes.

The multilayered ceramic capacitors have been widely used as components of computers and mobile communications devices such as personal digital assistances (PDAs), mobile phones, or the like, due to advantages such as a small size, high capacitance, ease of mounting, or the like.

Recently, as electronic products have been miniaturized and multi-functionalized, chip components have also become miniaturized and multi-functionalized. As a result, a need exists for miniaturizing multilayered ceramic capacitors and increasing the capacitance thereof.

In addition, multilayered ceramic capacitors have been usefully used as bypass capacitors disposed in a power supply circuit in a large scale integration (LSI) scheme. Multilayered ceramic capacitors need to have the capability to effectively remove high frequency noise in order to serve as bypass capacitors. This demand has been further increased as electronic devices having high frequencies become popular. The multilayered ceramic capacitor used as the bypass capacitor may be electrically connected to a mounting pad on a circuit board through soldering, and the mounting pad may be connected to other external circuits through wiring patterns or conductive vias on the circuit board.

SUMMARY OF THE INVENTION

An aspect of the present disclosure provides a multilayered ceramic capacitor and a board for mounting the same.

Another aspect of the present disclosure provides a multilayered ceramic capacitor. The multilayered ceramic capacitor includes a ceramic body including a dielectric layer and having first and second main surfaces opposing each other in a thickness direction, first and second end surfaces opposing each other in a length direction, and first and second side surfaces opposing each other in a width direction; a first internal electrode disposed in the ceramic body and having a first lead part exposed to at least one of the first and second side surfaces; a second internal electrode disposed to face the first internal electrode, having the dielectric layer therebetween, and having a second lead part exposed to at least one of the first and second side surfaces; a first external electrode electrically connected to the first lead part exposed to the side surface of the ceramic body and extending from the side surface of the ceramic body to which the first lead part is exposed, to at least one of the first and second main surfaces; a second external electrode electrically connected to the second lead part exposed to the side surface of the ceramic body and extending from the side surface of the ceramic body to which the second lead part is exposed, to at least one of the first and second main surfaces; and an insulating layer covering the first and second external electrodes formed on the first and second side surfaces.

Regions of the first lead part and the second lead part exposed to at least one of the first and second side surfaces may overlap with each other.

Regions of the first lead part and the second lead part exposed to at least one of the first and second side surfaces may not overlap with each other.

Lengths of the exposed regions of the first lead part and the second lead part exposed to at least one of the first and second side surfaces maybe smaller than widths of the first and second external electrodes formed on the first and second side surfaces.

The first internal electrode may be exposed to the first side surface of the ceramic body, and the second internal electrode may be exposed to the second side surface of the ceramic body.

The first lead part may be exposed to the first side surface, and the second lead part may be exposed to the second side surface.

The first and second external electrodes may extend from the first side surface to one of the first and second main surfaces.

The first and second external electrodes may extend from the first side surface to the first main surface and the second main surface.

The first and second external electrodes may extend from the first side surface to one of the first and second main surfaces, and the second side surface.

The first and second external electrodes may extend from the first side surface to the first and second main surfaces and the second side surface.

The first and second external electrodes may contact the first and second end surfaces.

The first and second external electrodes may be spaced apart from the first and second end surfaces by a predetermined interval.

The first external electrode may extend from the first side surface to the first main surface, and the second external electrode may extend from the second side surface to the first main surface.

The insulating layer may cover the first and second external electrodes formed on the first and second side surfaces and the first and second side surfaces of the ceramic body.

The insulating layer may cover the first and second external electrodes formed on the first and second side surfaces and the first and second side surfaces and the first and second end surfaces of the ceramic body.

The insulating layer may cover regions of the first and second external electrodes formed on the first and second side surfaces, from a mounting surface to a predetermined height thereof, and regions of the first and second side surfaces, from the mounting surface to a predetermined height thereof.

The insulating layer may be spaced apart from the mounting surface of the ceramic body by a predetermined interval.

The insulating layer may contain an organic resin, a ceramic, an inorganic filler, glass, or a mixture thereof.

The first and second internal electrodes maybe disposed to be horizontal with respect to the mounting surface of the ceramic body.

When an average thickness of the dielectric layer is td, $0.1\ \mu m \leq td \leq 2.0\ \mu m$ may be satisfied.

A thickness of each of the first and second internal electrodes may be 1.5 µm or less.

Another aspect of the present disclosure provides a board for mounting a multilayered ceramic capacitor. The board includes a printed circuit board having first and second electrode pads disposed thereon; and a multilayered ceramic capacitor installed on the printed circuit board. The multilayered ceramic capacitor includes: a ceramic body including a dielectric layer and having first and second main surfaces opposing each other in a thickness direction, first and second end surfaces opposing each other in a length direction, and first and second side surfaces opposing each other in a width direction; a first internal electrode disposed in the ceramic body and having a first lead part exposed to at least one of the first and second side surfaces; a second internal electrode disposed to face the first internal electrode, having the dielectric layer therebetween, and having a second lead part exposed to at least one of the first and second side surfaces; a first external electrode electrically connected to the first lead part exposed to the side surface of the ceramic body and extended from the side surface of the ceramic body to which the first lead part is exposed, to at least one of the first and second main surfaces; a second external electrode electrically connected to the second lead part exposed to the side surface of the ceramic body and extended from the side surface of the ceramic body to which the second lead part is exposed, to at least one of the first and second main surfaces; and an insulating layer covering the first and second external electrodes formed on the first and second side surfaces.

Another aspect of the disclosure relates to a multilayered ceramic capacitor. The multilayered ceramic capacitor comprises a ceramic body including a dielectric layer and having first and second main surfaces opposing each other in a thickness direction, first and second end surfaces opposing each other in a length direction, and first and second side surfaces opposing each other in a width direction; a first internal electrode disposed in the ceramic body and having a first lead part extending to and facing at least one of the first and second side surfaces; a second internal electrode disposed to face the first internal electrode, having the dielectric layer therebetween, and having a second lead part extending to and facing at least one of the first and second side surfaces; a first external electrode electrically connected to the first lead part and extending from a portion of the side surface of the ceramic body, to which the first lead part is exposed, to a portion of at least one of the first and second main surfaces; a second external electrode electrically connected to the second lead part and extending from a portion of the side surface of the ceramic body, to which the second lead part is exposed, to a portion of at least one of the first and second main surfaces; and an insulating layer covering a portion of the first and second external electrodes disposed on the first and second side surfaces.

The first electrode extends along a side of the side surface, the first main surface and second main surfaces adjacent to the first end surface, and the second external electrode extends along the other side of the side surface, the first main surface, and the second main surface adjacent to the second end surface.

The insulating layer covers a portion of the first and second side surfaces of the ceramic body. The insulating layer covers a portion of the first and second end surfaces of the ceramic body.

The insulating layer covers regions of the first and second external electrodes disposed on the first and second side surfaces, from a mounting surface to a predetermined height thereof, and regions of the first and second side surfaces, from the mounting surface to a predetermined height thereof.

Another aspect of the disclosure encompasses a multilayered ceramic capacitor. The multilayered ceramic capacitor comprises a ceramic body having a hexahedral shape defined by six side surfaces, and having a dielectric layer therein; a first internal electrode disposed in the ceramic body and having a first lead part extending to and facing at least one of the side surfaces; a second internal electrode disposed to face the first internal electrode, having the dielectric layer therebetween, and having a second lead part extending to and facing at least one of the side surfaces; a first external electrode electrically connected to the first lead part and extending from a portion of the side surface, to which the first lead part is exposed, to a portion of one of the six side surfaces; a second external electrode electrically connected to the second lead part and extending from a portion of the side surface, to which the second lead part is exposed, to a portion of at least one of the six side surfaces; and an insulating layer covering a portion of the first and second external electrodes.

The insulating layer covers the side surfaces on which the first and second external electrodes are disposed. The insulating layer covers at least one of the side surfaces adjacent to the side surfaces on which the first and second external electrodes are disposed.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
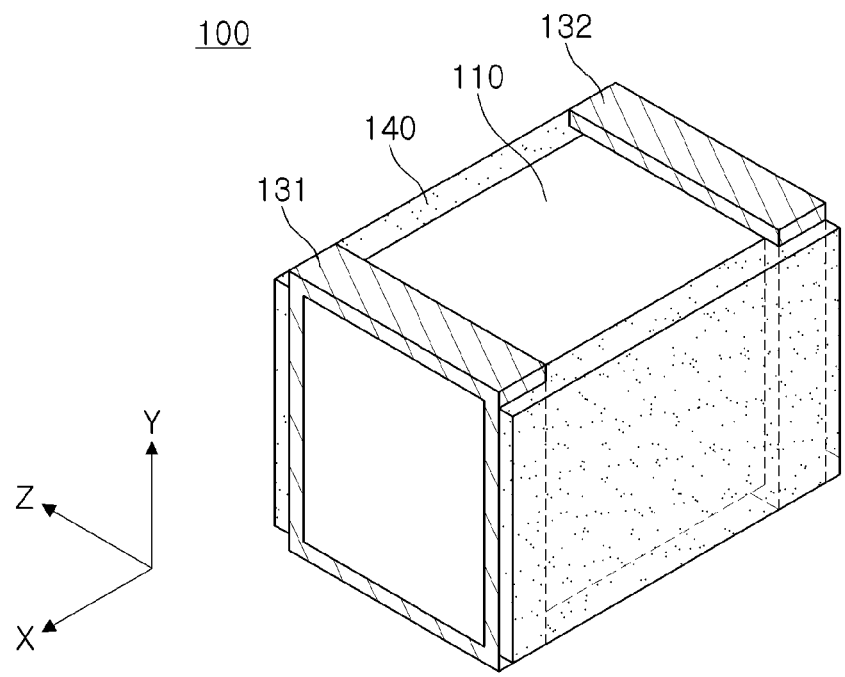
FIG. 1 is a perspective view schematically showing a multilayered ceramic capacitor according to an embodiment of the present disclosure.

Hereinafter, embodiments of the present disclosure will be described in detail with reference to the accompanying drawings. The inventive concept may, however, be embodied in many different forms and should not be construed as being limited to the embodiments set forth herein. Rather, these embodiments are provided so that this disclosure will be thorough and complete, and will fully convey the scope of the inventive concept to those skilled in the art.

Multilayered Ceramic Capacitor (100)

A multilayered ceramic capacitor 100 according to an embodiment of the present disclosure may include: a ceramic body 110 including a dielectric layer 111 and having first and second main surfaces 5 and 6 opposing each other in a thickness direction, first and second end surfaces 3 and 4 opposing each other in a length direction, and first and second side surfaces 1 and 2 opposing each other in a width direction; a first internal electrode 121 disposed in the ceramic body and having a first lead part 121a exposed to at least one of the first and second side surfaces; a second internal electrode 122 disposed so as to face the first internal electrode, having the dielectric layer disposed therebetween, and having a second lead part 122a exposed to at least one of the first and second side surfaces; a first external electrode 131 electrically connected to the first lead part exposed to the side surface of the ceramic body and extended from the side surface of the ceramic body to which the first lead part is exposed, to at least one of the first and second main surfaces; a second external electrode 132 electrically connected to the second lead part exposed to the side surface of the ceramic body and extended from the side surface of the ceramic body to which the second lead part is exposed, to at least one of the first and second main surfaces; and an insulating layer 140 covering the first and second external electrodes formed on the first and second side surfaces.

Embodiments of the present disclosure will now be described in detail with reference to the accompanying drawings.

Figure 2:
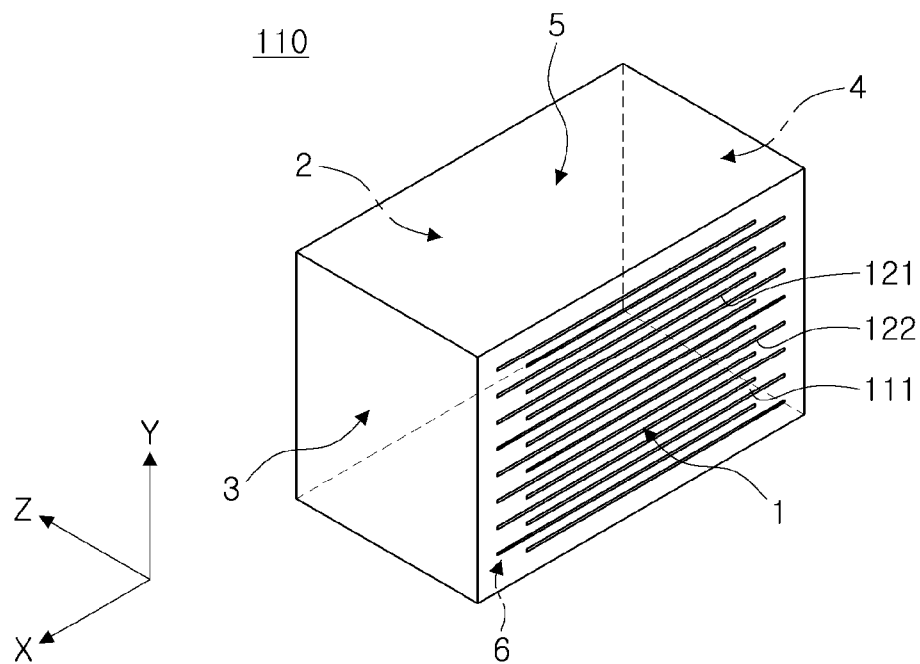
FIG. 2 is a perspective view schematically showing a ceramic body of the multilayered ceramic capacitor according to the embodiment of the present disclosure.
Figure 3:
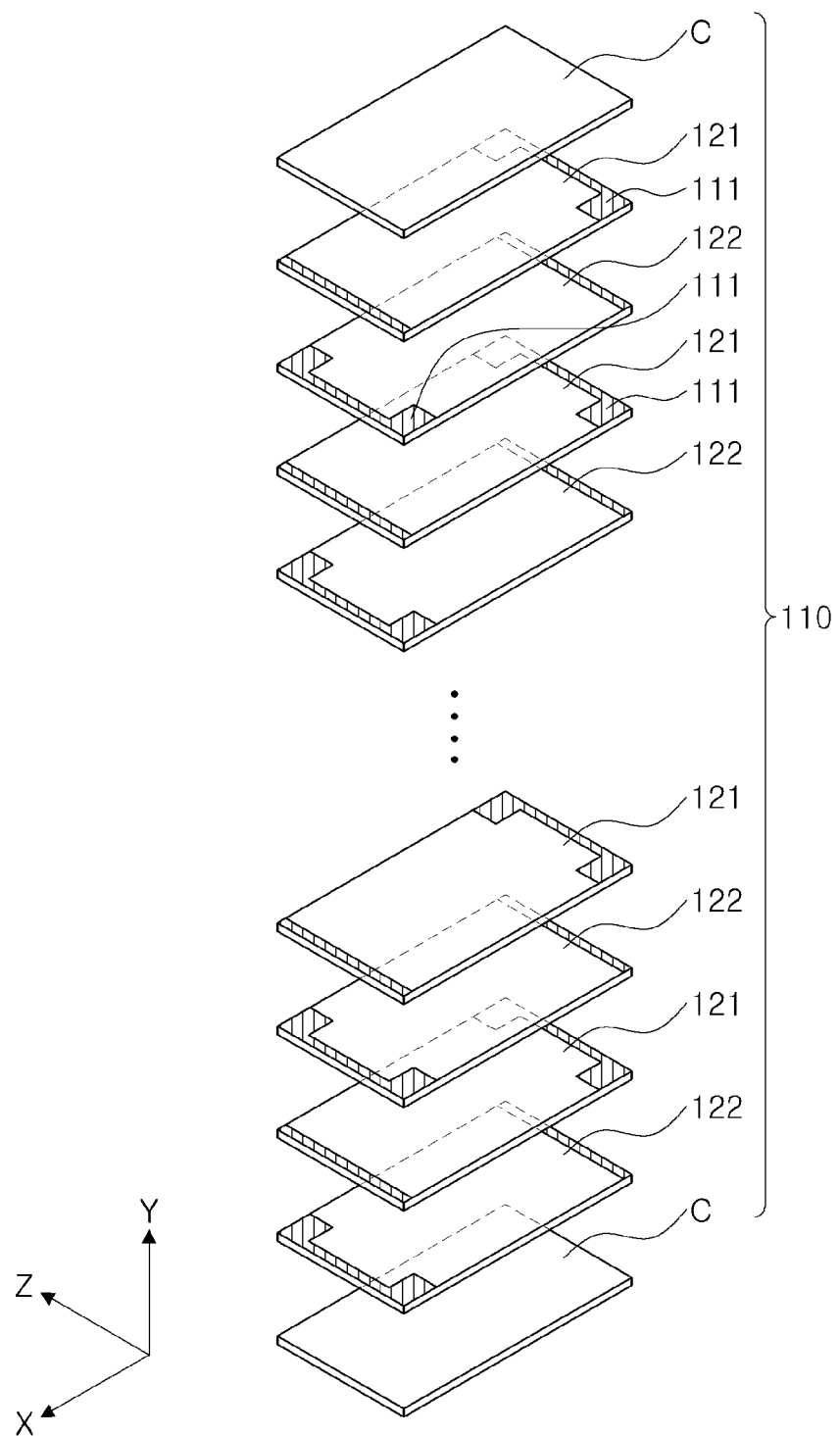
FIG. 3 is an exploded perspective view showing the ceramic body of the multilayered ceramic capacitor according to the embodiment of the present disclosure.

FIG. 1 is a perspective view schematically showing a multilayered ceramic capacitor according to an embodiment of the present disclosure, FIG. 2 is a perspective view schematically showing a ceramic body of the multilayered ceramic capacitor according to the embodiment of the present disclosure, and FIG. 3 is an exploded perspective view showing the ceramic body of the multilayered ceramic capacitor according to the embodiment of the present disclosure.

Referring to FIG. 1, the multilayered ceramic capacitor according to the embodiment of the present disclosure may include a ceramic body 110; and first and second external electrodes 131 and 132, and an insulating layer 140.

Referring to FIG. 2, the ceramic body 110 may have a first main surface 5 and a second main surface 6 opposing each other in a thickness direction, a first side surface 1 and a second side surface 2 opposing each other in a width direction and connecting to the first main surface and the second main surface, and a first end surface 3 and a second end surface 4 opposing each other in a length direction and connecting the first main surface 5 to the second main surface 6. Naming of the surfaces purports to explain the present disclosure conveniently, and each of the surfaces can be named differently.

The ceramic body 110 is not particularly limited to a specific shape, but for example, may have a hexahedral shape as shown in the drawings. At the time of firing a chip, the ceramic body 110 may not have a hexahedral shape having a complete straight line, but may have a substantially hexahedral shape.

The ceramic body 110 may include the plurality of dielectric layers 111 and the first and second internal electrodes 121 and 122 formed on the dielectric layer 111, and may be formed by stacking the plurality of dielectric layers having the internal electrodes formed thereon. In addition, the first and second internal electrodes 121, 122 may be disposed in a y-direction so as to face each other, having the dielectric layer 111 therebetween.

According to the embodiment of the present disclosure, the y-direction may be the thickness direction of the ceramic body and a direction in which the internal electrodes are stacked, having the dielectric layer therebetween, and an x-direction may be a length direction of the ceramic body, and a z-direction may be the width direction of the ceramic body.

Here, the 'thickness direction' may be the same as a direction in which the dielectric layers are stacked, that is, a 'stacking direction'.

The ceramic body 110 may be formed by stacking the plurality of dielectric layers 111 and performing a firing process, and a shape and a dimension of the ceramic body 110, and the number of the stacked dielectric layer 111 are shown in the drawings, but the present disclosure is not limited thereto.

In addition, the plurality of dielectric layers 111 forming the ceramic body 110 may be in a sintered state, and dielectric layers 111 adjacent to each other may be integrated so that it is difficult to confirm a boundary therebetween without using a scanning electron microscope (SEM).

According to the embodiment of the present disclosure, an average thickness of the dielectric layer 111 may be arbitrarily changed according to a desired capacitance of the multilayered ceramic capacitor 100, but may be 0.1 to 2.0 μm after performing the firing process.

The average thickness of the dielectric layer 111 may be measured by scanning the cross-section of the ceramic body 110 in a width direction as an image using the SEM.

For example, the average thickness of the dielectric layer 111 may be calculated by measuring a thickness of an arbitrary dielectric layer at thirty equidistant points in a width direction in an image obtained by scanning a cross section of the dielectric layer 111 in a width-thickness (y-z) direction, which is cut at the central portion of the ceramic body 110 in a length (x) direction using the scanning electron microscope (SEM).

The thirty equidistant points in a width direction may be measured in a capacitance forming part, wherein the capacitance forming part refers to a region in which the first and second internal electrodes 121 and 122 overlap with each other.

In addition, in the case in which the average value measurement is applied to at least 10 dielectric layers to thereby measure the average values of at least 10 dielectric layers, the average thickness of the dielectric layer may be significantly generalized.

A material forming the first and second internal electrodes 121 and 122 is not particularly limited, but may be a conductive paste formed of at least one precious metal such as palladium (Pd), palladium-silver (Pd—Ag) alloy, or the like, nickel (Ni), and copper (Cu).

Meanwhile, the first and second internal electrodes 121 and 122, a pair of electrodes having different polarities, may be formed on the dielectric layer 111 by printing a conductive paste including a conductive metal at a predetermined thickness.

The average thickness of the first and second internal electrodes 121 and 122 after the firing process is not particularly limited to specific values as long as the internal electrode may have capacitance. For example, the average thickness of the first and second internal electrodes may be 1.5 μm or less.

The average thickness of the internal electrodes 121 and 122 may be measured by scanning the cross-section of the ceramic body 110 in the width direction as an image using SEM.

For example, the average thickness of the internal electrodes 121, 122 may be calculated by measuring a thickness of an arbitrary internal electrode at thirty equidistant points in a width direction in an image obtained by scanning a cross section of the internal electrodes 121, 122 in a width-thickness (y-z) direction, which is cut at the central portion of the ceramic body 10 in a length direction, using the scanning electron microscope (SEM).

The equidistant thirty points may be measured in a capacitance forming part, wherein the capacitance forming part refers to a region in which the first and second internal electrodes 121 and 122 overlap with each other.

In addition, in the case in which the average value measurement is applied to at least 10 internal electrodes to measure the average values of at least 10 internal electrodes, the average thickness of the internal electrodes may be generalized.

According to the embodiment of the present disclosure, the first and second internal electrodes 121 and 122 may be disposed horizontally to the mounting surface, that is, the first main surface 5 or the second main surface 6, of the multilayered ceramic capacitor.

In the embodiment of the present disclosure, 'first' and 'second' may refer to different polarities.

FIGS. 4A through 4G are plan views showing an internal electrode of the multilayered ceramic capacitor according to the embodiment of the present disclosure.

The first and second internal electrodes 121 and 122 according to the embodiment of the present disclosure may include the first and second lead parts 121a and 122a exposed and extending to an external surface of the ceramic body and electrically connected to the first and second external electrodes 131, 132, respectively.

The first and second lead parts 121a and 122a may be exposed to at least one side surface of the ceramic body and the internal electrode of the multilayered ceramic capacitor according to the embodiment of the present disclosure may be modified to have various shapes.

The first and second lead parts 121a and 122a may be exposed and extend to at least one side surface of the ceramic body. That is, the first and second lead parts 121a and 122a may be exposed and extend to the first side surface 1 or the second side surface 2 or may be exposed and extend to the first and second side surfaces 1 and 2.

Figure 4A:
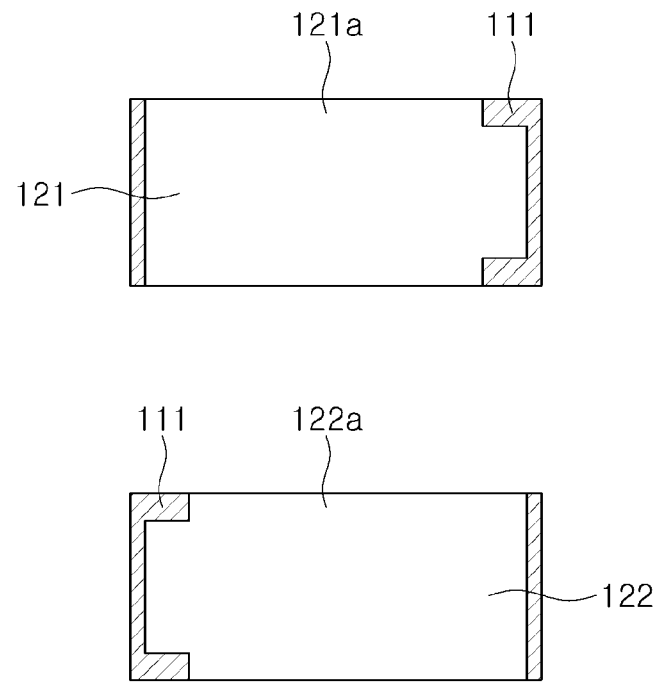
FIGS. 4A through 4G are plan views showing an internal electrode of the multilayered ceramic capacitor according to the embodiment of the present disclosure.

In addition, referring to FIG. 4A, the first and second lead parts 121a and 122a may be formed such that regions thereof exposed to at least one side surface of the ceramic body may have an overlapped region in the width direction (y-direction). In the case in which the lead parts have the overlapped region as shown in FIG. 4A, additional capacitance is formed by the overlapped area of the lead parts, such that the multilayered ceramic capacitor having high capacitance may be provided.

Figure 4B:
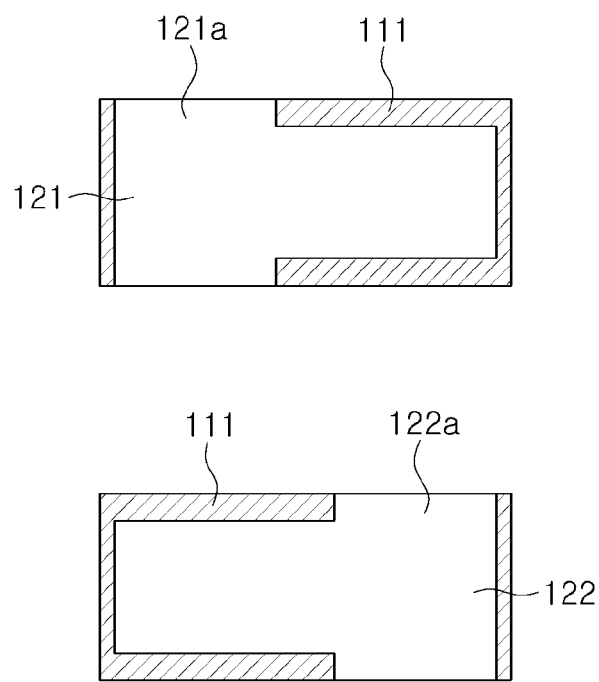

In addition, as shown in FIG. 4B, the regions of the first and second lead parts 121a and 122a exposed to at least one side surface of the ceramic body may be formed so as not to have the overlapped area. In the case in which the first and second lead parts are significantly exposed while not having an overlapped area, a phenomenon, in which the first and second internal electrodes are connected to each other due to dispersion of the internal electrodes occurring when cutting the ceramic body, may be prevented, and removal of a residual carbonaceous material generated at the time of a firing process may be facilitated.

Figure 4C:
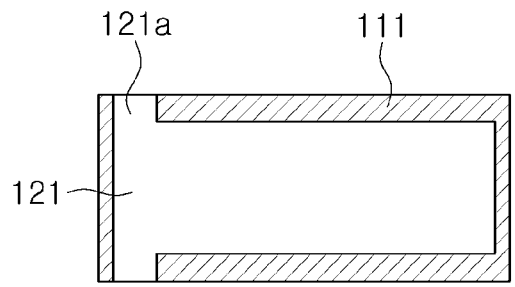
Figure 4C:
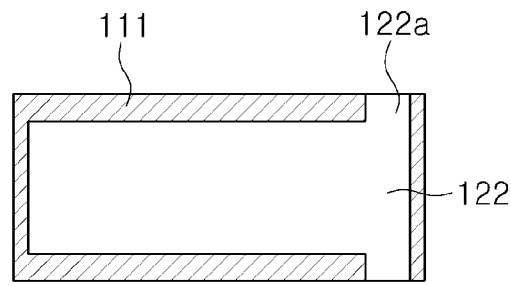

Further, as shown in FIG. 4C, the lengths of the exposed regions of the first and second lead parts 121a and 122a exposed and extending to the side surface of the ceramic body may be significantly small. In comparison with the width of an external electrode to be formed later, the lengths of the exposed regions of the first and second lead parts may be smaller than the widths of the external electrodes. In the case in which the lengths of the exposed regions of the first and second lead parts are smaller than the widths of the external electrodes, the external electrodes may cover the exposed first and second lead parts 121a, 122a, such that the insulating layer 140 to cover the first and second lead parts 121a, 122a may not be required. In this case, the insulating layer 140 may only be formed to cover the external electrode, which will be described below.

Figure 4D:
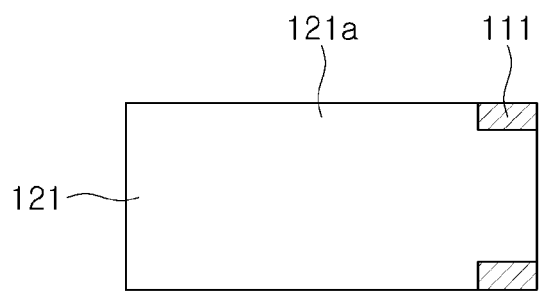
Figure 4D:
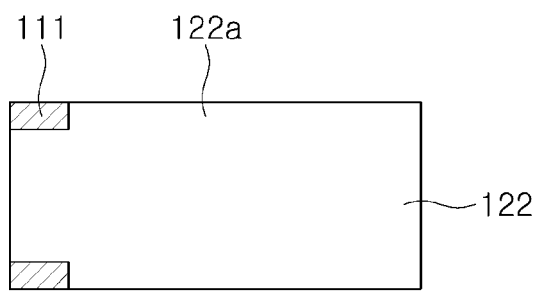
Figure 4E:
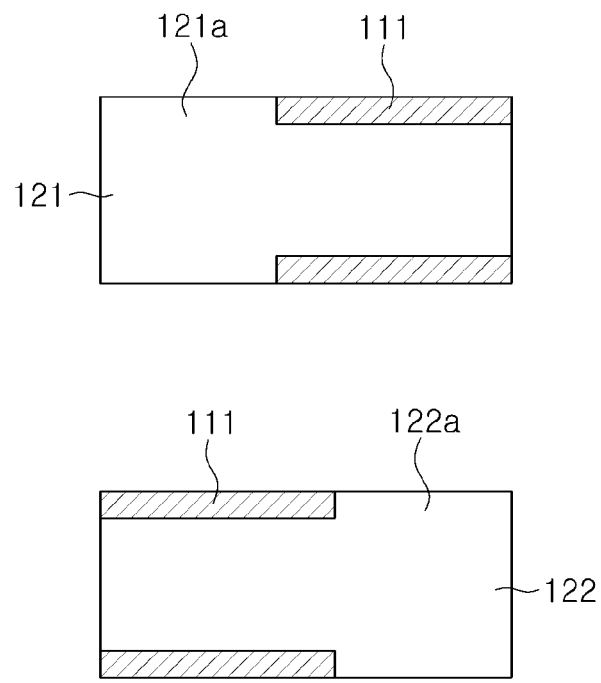
Figure 4F:
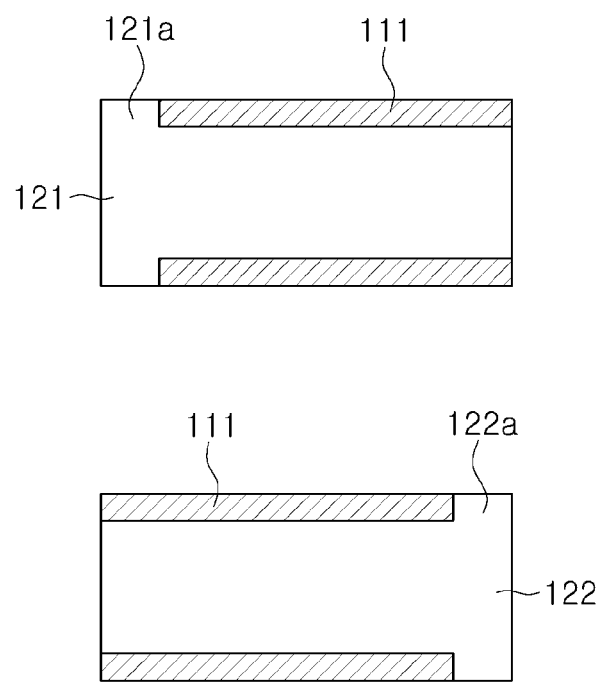

In addition, as shown in FIGS. 4D to 4F, the first and second internal electrodes 121 and 122 may have the first and second lead parts 121a, 122a exposed and extending to at least one side surface 1, 2 of the ceramic body and may be exposed to the first and second end surfaces 3, 4. As described above as to FIGS. 4A to 4C, the exposed regions of the first and second lead parts 121a and 122a may overlap with each other as shown in FIGS. 4D to 4F. In addition, the exposed regions of the first and second lead parts 121a, 122a may not overlap with each other and the lengths of the exposed regions of the first and second lead parts 121a, 122a may be smaller than the widths of the external electrodes 131, 132.

As described above, the first and second internal electrodes 121 and 122 may be exposed and extend to the first and second end surfaces 3, 4 of the ceramic body, and in the case in which the first and second lead parts 121a and 122a exposed to the side surface 1, 2 of the ceramic body have an overlapped area, the multilayered ceramic capacitor having a large capacitance in the same area may be implemented.

In the case in which the first and second internal electrodes 121 and 122 are exposed and extend to the first and second end surfaces 3, 4 of the ceramic body, the insulating layer 140 may be formed up to the first and second end surfaces in order to protect the internal electrode and prevent occurrence of short-circuit, which will be described below.

Figure 4G:
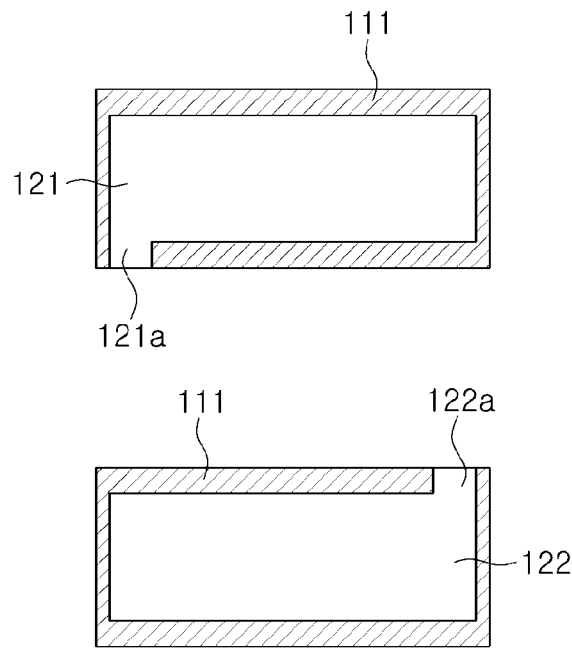

As shown in FIG. 4G, the first and second lead parts 121a and 122a of the internal electrode according to the embodiment of the present disclosure may be respectively exposed to different side surfaces. That is, the first lead part 121a may be exposed to the first side surface 1 and the second lead part 122a may be exposed to the second side surface 2.

The first and second internal electrodes 121 and 122 may be electrically insulated by the dielectric layer 111 disposed therebetween.

That is, the first and second internal electrodes 121 and 122 may be electrically connected to the first and second external electrodes 131 and 132, respectively, through the first and second lead parts 121a, 122a exposed through the side surface 1, 2 of the ceramic body 110.

Therefore, in the case in which a voltage is applied to the first and second external electrodes 131 and 132, electric charges are accumulated between the first and second internal electrodes 121 and 122 opposing each other. Here, the capacitance of the multilayered ceramic capacitor 100 is in proportion to an area of a region in which the first and second internal electrodes 121 and 122 overlap with each other.

FIGS. 5A to 5F are perspective views showing a ceramic body and an external electrode of the multilayered ceramic capacitor according to the embodiment of the present disclosure.

Referring to FIGS. 5A to 5F, the first and second external electrodes 131 and 132 may be connected to the first and second internal electrodes 121 and 122, respectively.

The first external electrode 131 may be electrically connected to the first internal electrode 121 and may extend from at least one of the first side surface 1 and the second side surface 2 to at least one of the first main surface 5 and the second main surface 6, and the second external electrode 132 may be electrically connected to the second internal electrode 122 and may extend from at least one of the first side surface 1 and the second side surface 2 to at least one of the first main surface 5 and the second main surface 6.

Figure 5A:
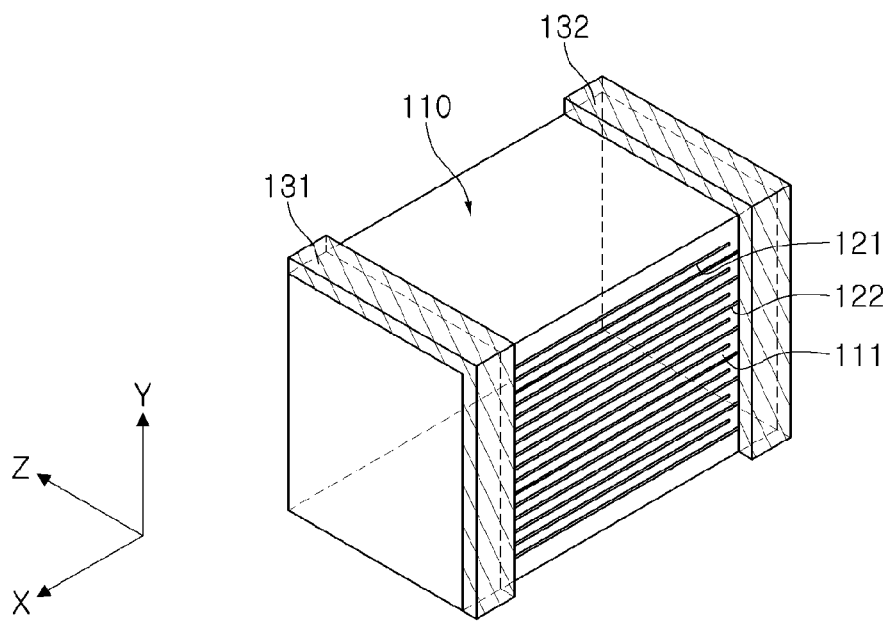
FIGS. 5A through 5F are perspective views showing a ceramic body and an external electrode of the multilayered ceramic capacitor according to the embodiment of the present disclosure.
Figure 5B:
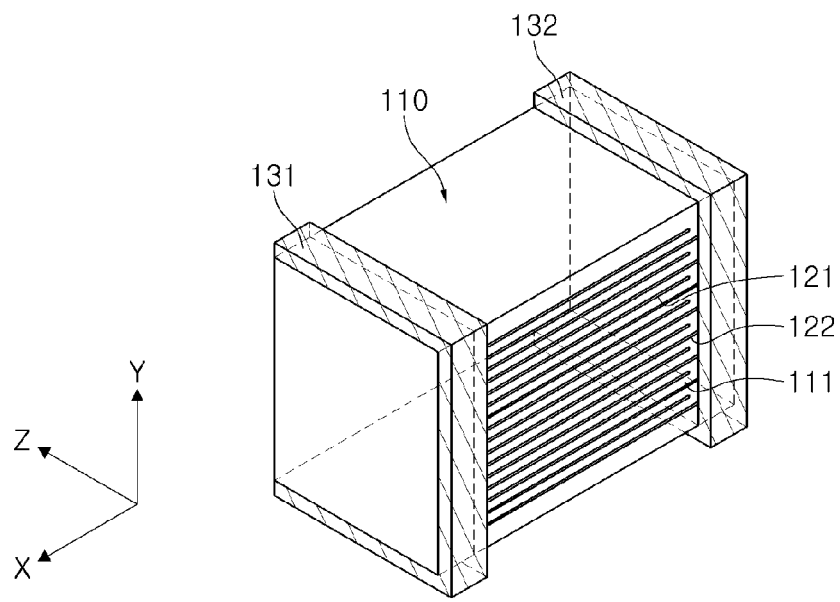
Figure 5C:
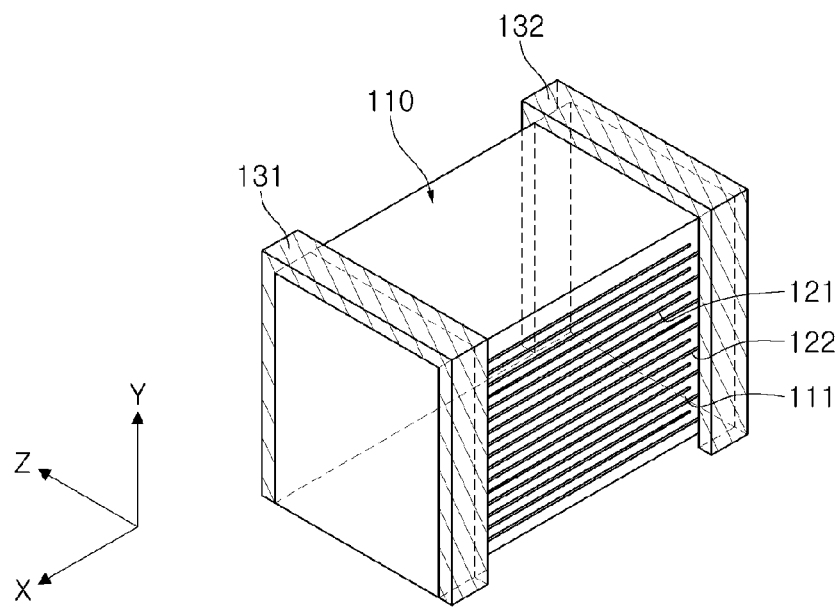

More specifically, the first and second external electrodes 131 and 132 may extend from the first side surface to one of the first and second main surfaces 5, 6 (FIG. 5A), or may extend to the first main surface 5 and the second main surface 6 (FIG. 5B), or may extend to one of the first and second main surfaces 5, 6, and the second side surface 2 (FIG. 5C).

Figure 5D:
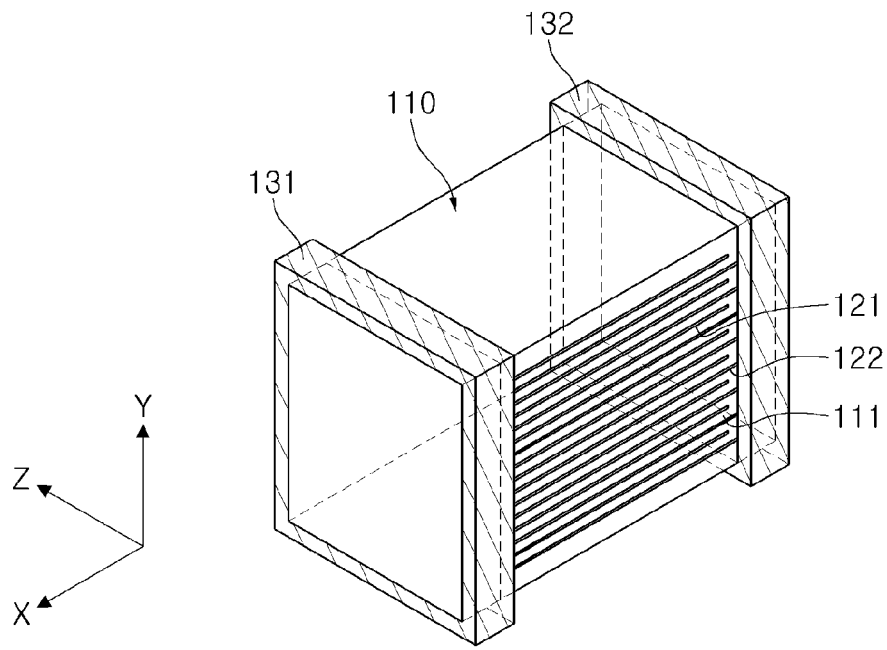

The first and second external electrodes 131 and 132 may extend from the first side surface 1 to the first and second main surfaces 5, 6 and to the second side surface 2, and in this case, the first and second external electrodes 131, 132 may have a '☐' shape (FIG. 5D).

Figure 5E:
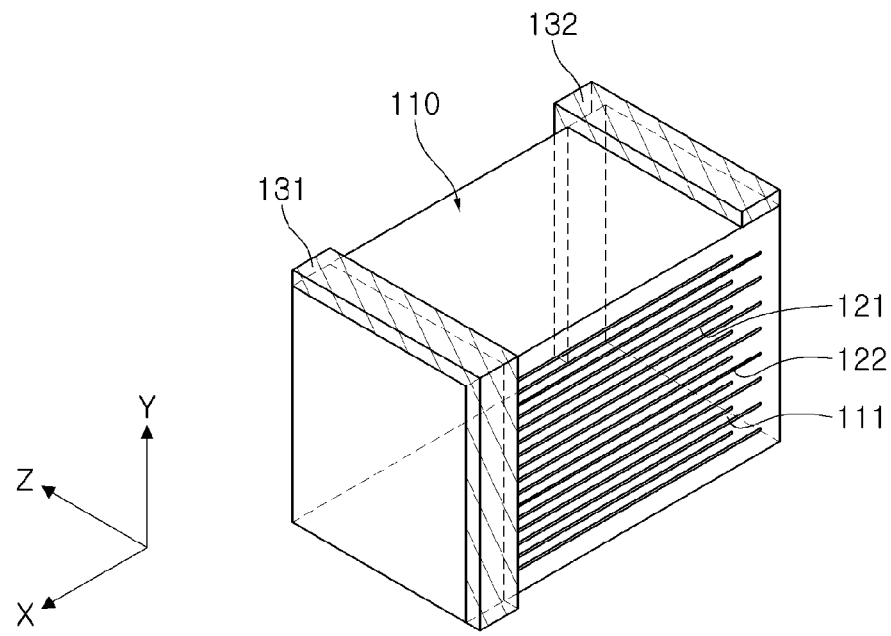

In addition, the first and second external electrodes 131 and 132 may be formed on the different side surfaces to extend to a single main surface. In other words, the first external electrode 131 may be formed on the first side surface 1, and the second external electrode 132 may be formed on the second side surface 2, and in this case, the first and second external electrodes 131, 132 may extend from the first or the second side surface 1, 2 to at least one of the first and second main surfaces 5, 6 (FIG. 5E).

Figure 5F:
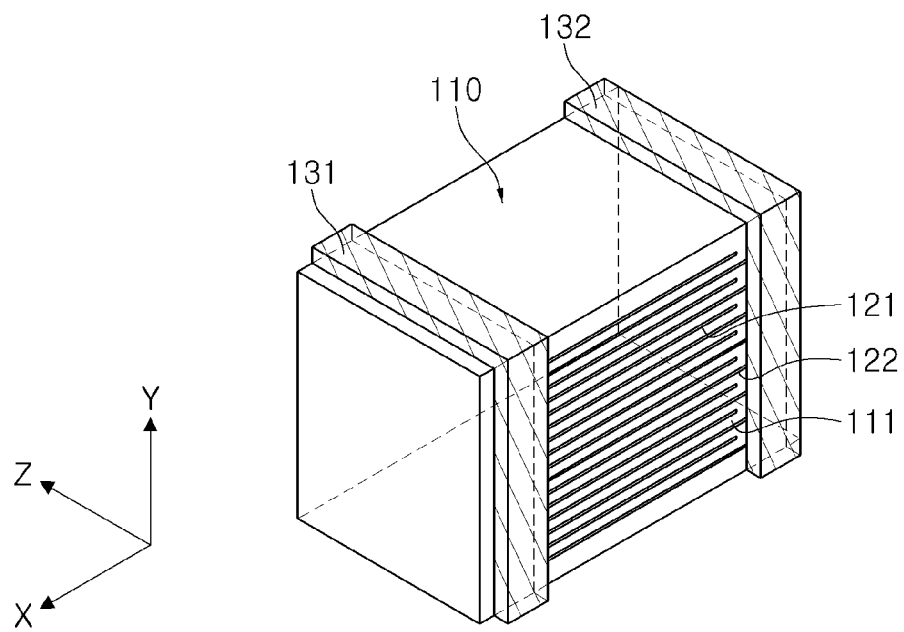

Further, the first and second external electrodes 131, 132 may extend from at least one of the first and second side surfaces 1, 2 to at least one of the first and second main surfaces 5, 6 while being in contact with the first and second end surfaces 3, 4, and may also be spaced apart from the first and second end surfaces 3, 4 by a predetermined interval (FIG. 5F).

A shape of the above-described external electrode may be appropriately changed without particular limitations. However, in order to allow the internal electrode to be horizontally disposed on a mounting surface, the external electrode may extend to at least one surface of the first and second main surfaces 5, 6 of the ceramic body.

The external electrodes 131 and 132 may be formed of the same conductive materials as that of the internal electrode, but are not limited thereto. For example, the external electrodes may be formed of copper (Cu), silver (Ag), nickel (Ni), or the like.

The first and second external electrodes 131 and 132 maybe formed by applying a conductive paste prepared by adding glass frit to a metal powder and performing a firing process.

FIGS. 6A to 6F are perspective views showing the ceramic body, the external electrode, and the insulating layer of the multilayered ceramic capacitor according to the embodiment of the present disclosure.

Meanwhile, according to the embodiment of the present disclosure, the insulating layer 140 may cover the first and second external electrodes 131 and 132 formed on the first and second side surfaces 1, 2 of the ceramic body 110.

Figure 6A:
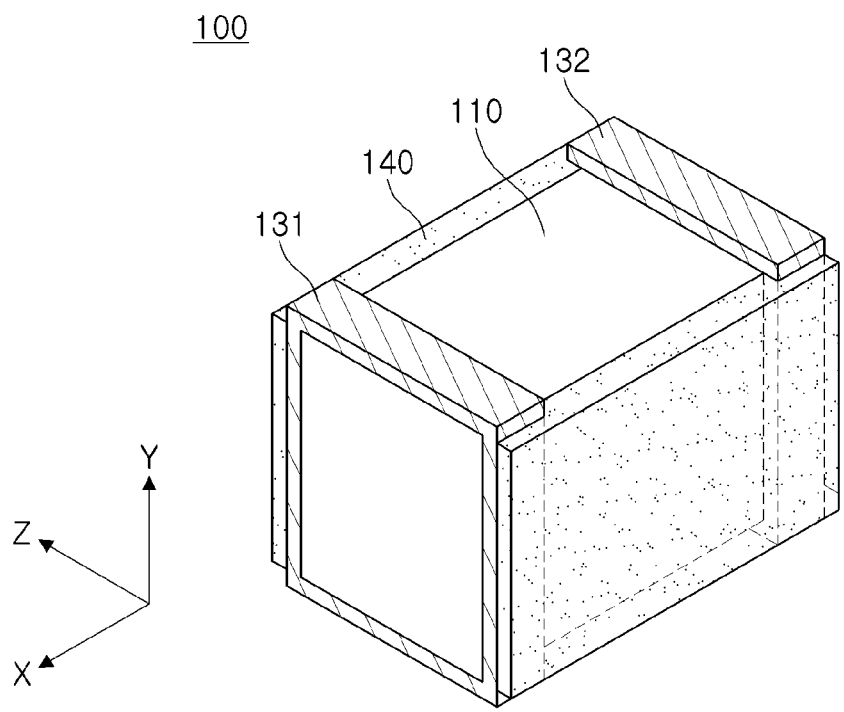
FIGS. 6A through 6F are perspective views showing the ceramic body, the external electrode, and an insulating layer of the multilayered ceramic capacitor according to the embodiment of the present disclosure.

As shown in FIG. 6A, the insulating layer 140 according to the embodiment of the present disclosure may cover the first and second external electrodes 131, 132 formed on the first and second side surfaces 1, 2 and the first and second side surfaces 1, 2.

That is, the insulating layer 140 covers the external electrode formed on the first and second side surfaces 1, 2 such that the external electrode is not exposed to the first and second side surfaces 1, 2, but extends to and is exposed to the first main surface 5 or the second main surface 6, and in this case, the first or the second main surface 5, 6 may be a mounting surface. In the case in which the first or the second main surface 5, 6 is the mounting surface according to the embodiment of the present disclosure, the internal electrode may be disposed to be horizontal with respect to the mounting surface.

Since the dielectric layer 111 has piezoelectric and electrostrictive properties, when a direct current voltage or an alternating current voltage is applied to the multilayered ceramic capacitor, a piezoelectric phenomenon may be generated between the internal electrodes 121, 122 to generate vibrations.

The vibration is transferred to a printed circuit board having the multilayered ceramic capacitor mounted thereon through a solder of the multilayered ceramic capacitor, such that the entire printed circuit board becomes a sound reflecting surface to generate vibration sound, which becomes noise.

The vibration sound may be within an audible frequency range of 20 to 20000 Hz, and this vibration sound may give an unpleasant feeling to listeners and is known as acoustic noise.

In the case in which the internal electrode and the dielectric layer of the multilayered ceramic capacitor are disposed on the mounting surface (substrate) to be perpendicular thereto, the vibration may be easily transmitted to the printed circuit board as compared to the case in which they are horizontally disposed on the mounting surface. Therefore, in order to decrease the acoustic noise, the internal electrode and the dielectric layer may be disposed so as to be perpendicular with regard to the mounting surface. Meanwhile, in the case in which the lead parts of the internal electrode are exposed to the same surface of the ceramic body in order to increase capacitance and improve a mounting density, the dielectric layer and the internal electrode may be disposed so as to be perpendicular with regard to the mounting surface. However, according to the embodiment of the present disclosure, the external electrode extends to at least one of first and second main surfaces, such that the first and second main surfaces become the mounting surface, thereby allowing for the internal electrode and the dielectric layer to be disposed horizontally with respect to the mounting surface.

In addition, the acoustic noise may be closely related to a solder's position at the time of mounting the multilayered ceramic capacitor on the board. As an amount of the solder disposed on the surface perpendicular to the mounting surface increases, the vibration due to a piezoelectric phenomenon may be easily transferred to the printed circuit board to thereby increase acoustic noise. Therefore, when the amount of solder formed on the surface of the multilayered ceramic capacitor perpendicular to the mounting surface significantly decreases, the acoustic noise may be significantly reduced.

The solder disposed on the mounting surface moves upwardly along the external electrode to a surface perpendicular to the mounting surface, via a surface tension. In the embodiment of the present disclosure, the external electrode exposed to the surface perpendicular to the mounting surface may be covered by the insulating layer, such that the solder does not moved upwardly to a significantly small extent, thereby significantly reducing the acoustic noise.

Figure 6B:
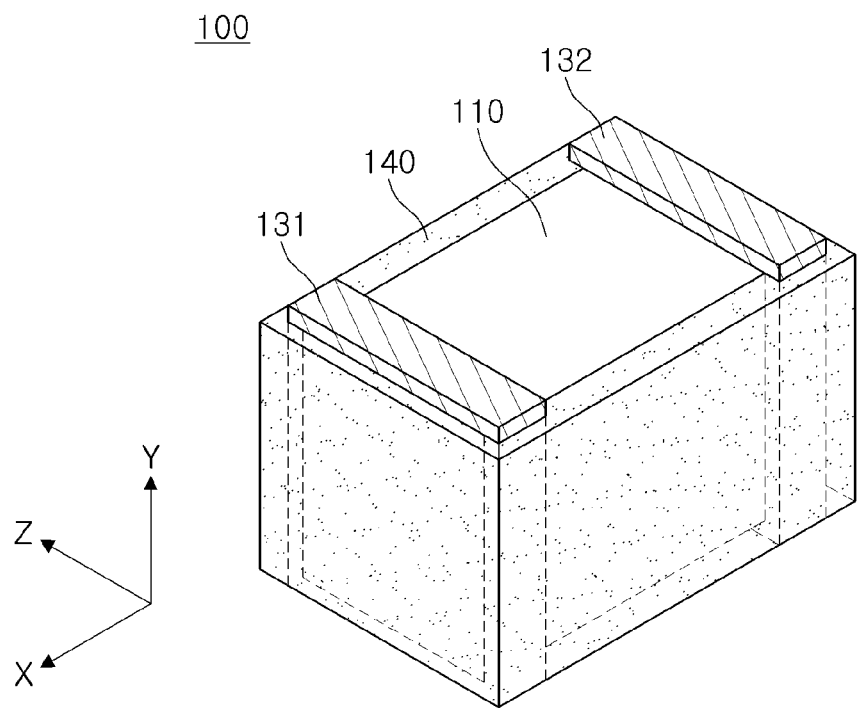

In addition, in the case in which the first and second internal electrodes 121, 122 are exposed to the first and second end surfaces 3, 4 of the ceramic body 100, the insulating layer 140 may cover the first and second external electrodes 131, 132, the first and second side surfaces 1, 2, and the first and second end surfaces 3, 4 as shown in FIG. 6B.

Figure 6C:
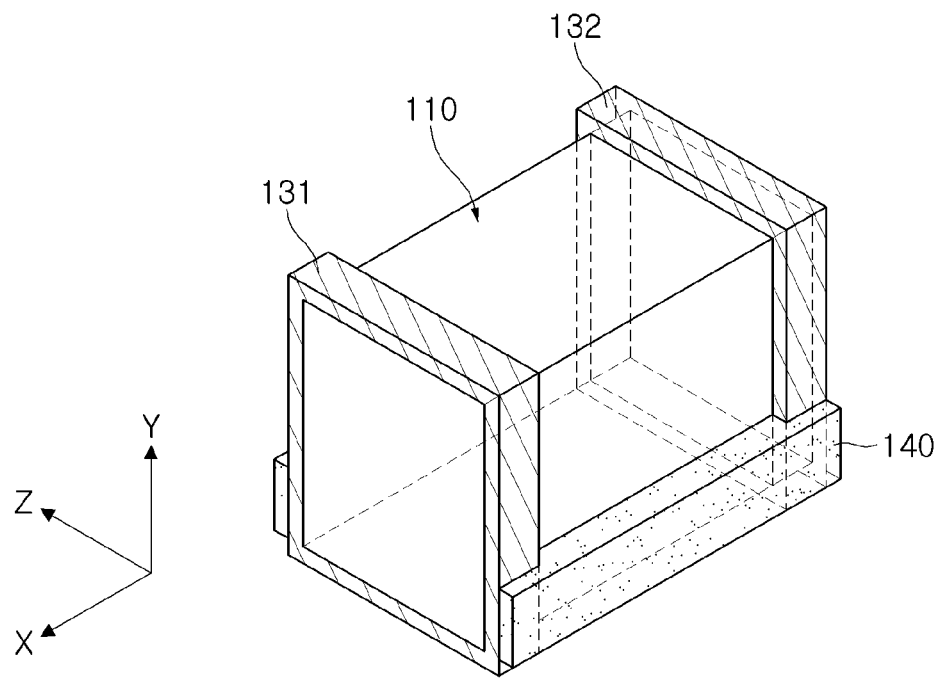
Figure 6D:
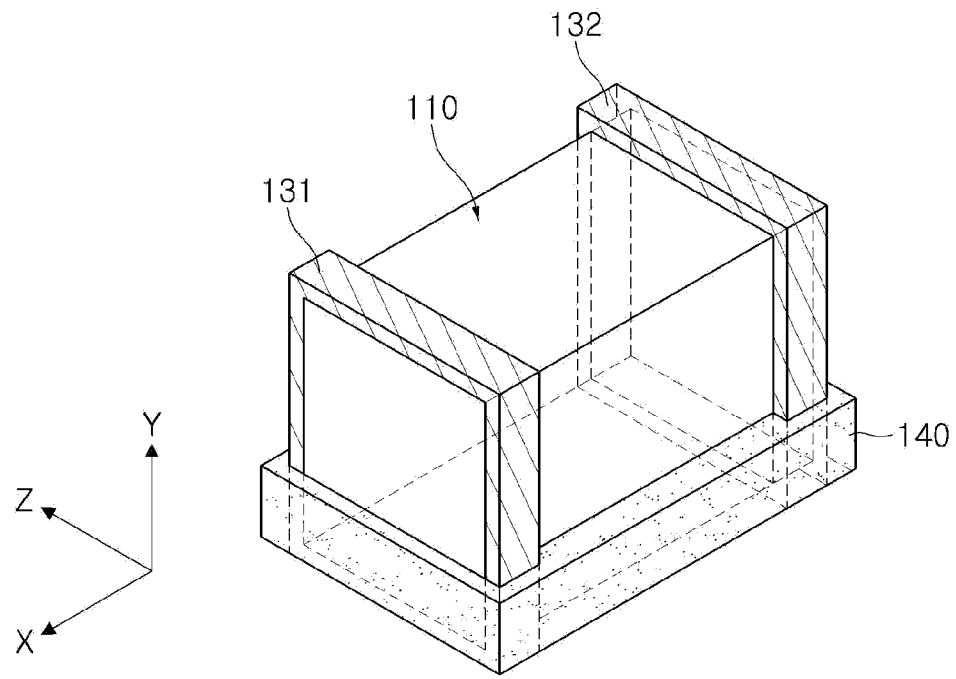

As shown in FIGS. 6C and 6D, the insulating layer may not be entirely formed in a thickness direction of the ceramic body but may be formed from the mounting surface of the ceramic body mounted on the substrate up to a predetermined height. The insulating layer 140, according to the embodiment of the present disclosure, may prevent the solder from moving upwardly to the surface perpendicular to the mounting surface (the first or second main surface) of the ceramic body, such that a case in which the insulating layer 140 is formed from the mounting surface to a predetermined height may achieve the same purpose as the above-described case, and the material for forming the insulating layer 140 may be used in relatively small amounts to thereby reduce costs.

Figure 6E:
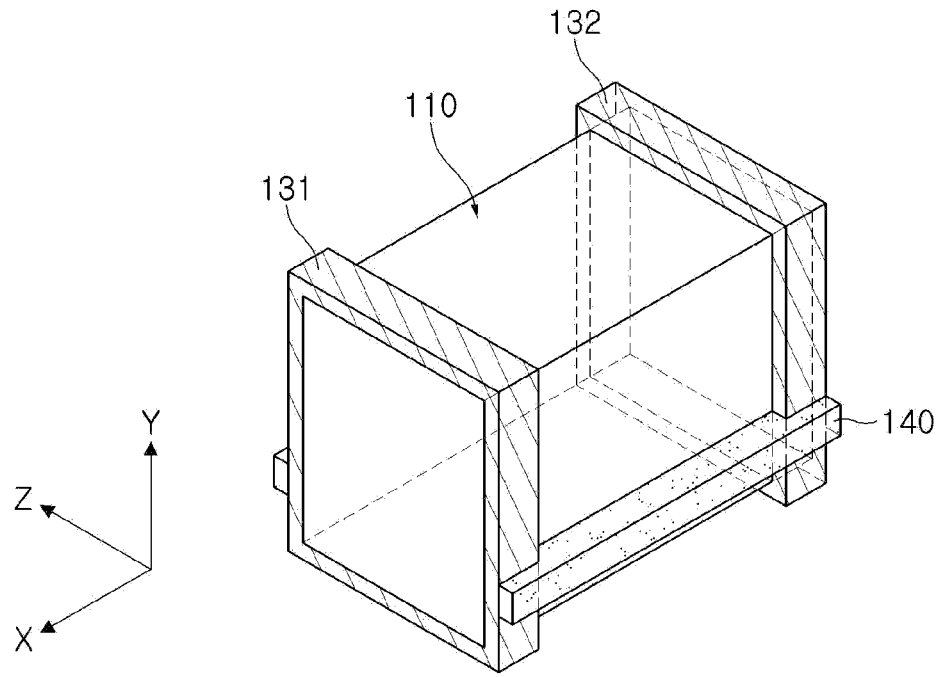
Figure 6F:
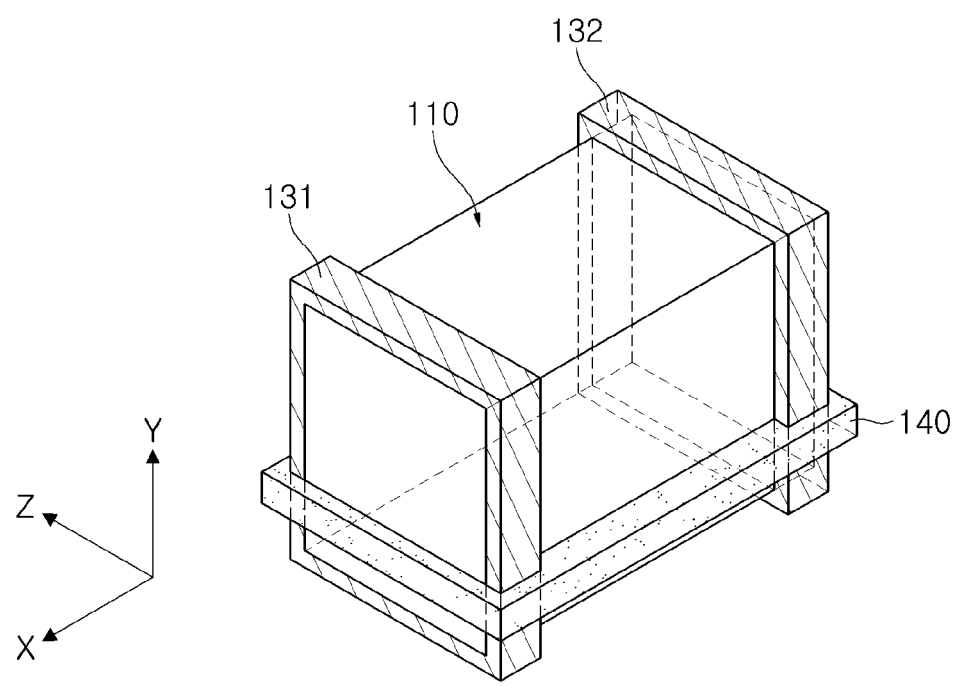

In addition, as shown in FIGS. 6E and 6F, the insulating layer 140 may be spaced apart from the mounting surface of the ceramic body by a predetermined interval. As shown in FIGS. 6E and 6F, in the case in which the insulating layer 140 is spaced apart from the mounting surface by a predetermined interval, the solder may slightly move upwardly along the external electrode not covered by the insulating layer, but rather, adhesive strength may be improved. Therefore, the insulating layer 140 may be spaced apart from the mounting surface by a predetermined interval to an extent such that a great amount of acoustic noise is not produced.

As shown in FIGS. 6C to 6F, in the case in which the side surface 1, 2 or the end surface 3, 4 of the ceramic body is not entirely covered by the insulating layer 140, but is covered thereby to a predetermined height, that is, in a portion thereof, the lengths of the exposed regions of the first and second lead parts 121a, 122a of the internal electrodes 121, 122 are smaller than the widths of the first and second external electrodes 131, 132 as shown in FIG. 4C, such that the internal electrode may not be exposed to an external surface of the ceramic body.

The material of the insulating layer 140 is not particularly limited, but may contain an organic resin, a ceramic, an inorganic filler, glass, or a mixture thereof.

According to the embodiment of the present disclosure, the above-described internal electrode 121, 122, the external electrode 131, 132, and the insulating layer 140 may have various shapes.

Figure 9:
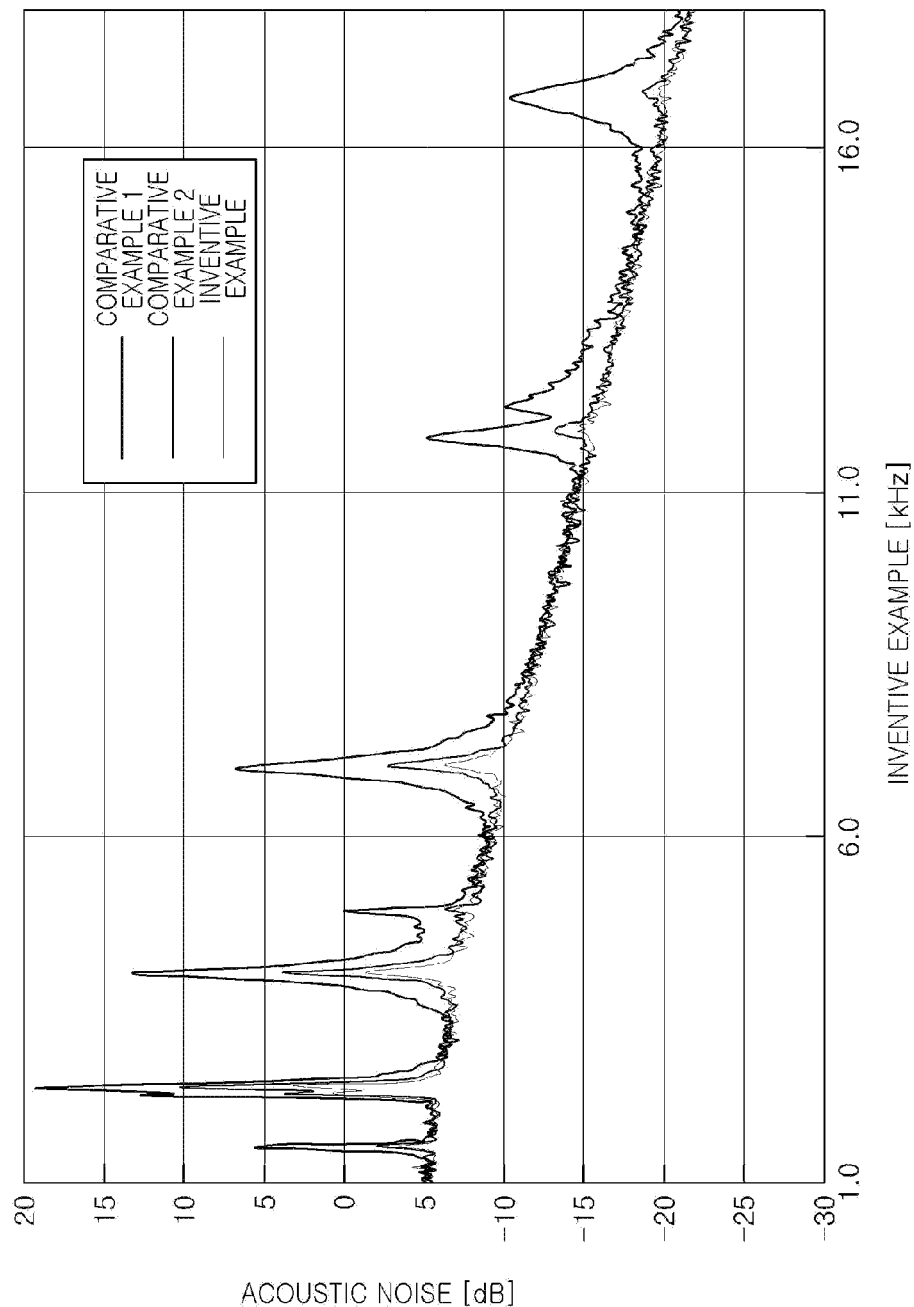
FIG. 9 is a graph showing results obtained by measuring acoustic noise of the multilayered ceramic capacitor according to an Inventive Example and Comparative Examples of the present disclosure.

FIG. 9 is a graph showing results obtained by measuring the acoustic noise of the multilayered ceramic capacitor according to an Inventive Example of the present disclosure and the acoustic noise of the multilayered ceramic capacitors according to Comparative Examples 1 and 2 in an audible frequency band.

The multilayered ceramic capacitors according to the Inventive Example and the Comparative Examples 1 and 2 were manufactured by the following process.

First, a slurry containing a powder such as a barium titanate ($BaTiO_3$) powder having an average particle size of 0.1 µm, or the like, was applied and dried onto a carrier film to prepare a plurality of ceramic green sheets having a thickness of 0.95 µm to 1.05 µm, thereby forming the dielectric layer.

Then, a conductive paste for the internal electrode containing 40 to 50 parts by weight of a nickel powder having an average particle size of 0.1 to 0.2 µm was prepared.

The conductive paste for the internal electrode was applied to the green sheet by a screen printing method to thereby form the internal electrode, and 500 layers or more of green sheets were then stacked to thereby form a multilayer body.

Then, the multilayered body was compressed and cut to form a chip of 0603 (length×width) size, where the chip has a ratio of thickness to width of more than 1.0, and the chip was fired at a temperature of 1050 to 1200° C. under a reducing atmosphere in which $H_2$ was 0.1% or less.

A polishing process was performed on respective edges and an apex of the chip using a polishing apparatus before the firing of the chip.

Meanwhile, in the Comparative Example 1, the first and second internal electrodes were exposed to the first and second end surfaces of the ceramic body, respectively, and in the Inventive Example and the Comparative Example 2, the first and second lead parts were formed so that the first and second internal electrodes are exposed to the first side surface.

In addition, in the Comparative Example 1, the external electrode 131, 132 was formed on the first and second end surfaces 3, 4, and in the Comparative Example 2, after the external electrode 131, 132 was formed on the first side surface 1 on which the first and second internal electrodes 121, 122 are exposed, the external electrode 131, 132 does not extend to the first or the second main surface 5, 6, and in the Inventive Example, after the external electrode 131, 132 formed on the first side surface 1 extends to the first main surface 5, a process of covering the external electrode 131, 132 formed on the first side surface 1 with the insulating layer 140 was additionally performed.

Then, the multilayered ceramic capacitors according to the Comparative Examples 1 and 2, and the Inventive Example of the present disclosure were mounted on the substrate, a voltage was applied thereto, and acoustic noise was measured.

As shown in FIG. 9, it could be appreciated that the acoustic noise was decreased in a sequence of the Comparative Example 1—Comparative Example 2—Inventive Example.

That is, it could be appreciated that in the multilayered ceramic capacitor according to the Inventive Example of the present disclosure, the acoustic noise was significantly decreased as compared to a general multilayered ceramic capacitor in which the first and second internal electrodes are exposed to end surfaces opposing each other, respectively or a general lower surface electrode-type multilayered ceramic capacitor in which the first and second internal electrodes are exposed to the same surface and the internal electrodes are mounted on the mounting surface to be perpendicular thereto.

According to the embodiment of the present disclosure as described above, an area in which the first and second internal electrodes overlap with each other may be significantly increased to implement a relatively high capacitance, and the insulating layer is formed on a surface of the ceramic body not having margins thereof to serve the same role as the margin, thereby easily controlling a thickness of a margin region. Therefore, a size of the multilayered ceramic capacitor may be decreased.

In addition, the external electrode may be formed on the same surface of the ceramic body to improve the mounting density, and the internal electrode may be horizontally mounted due to extension of the external electrode to thereby reduce acoustic noise.

Specifically, in the multilayered ceramic capacitor according to the embodiment of the present disclosure, since the external electrode is exposed to the main surface of the ceramic body, and the external electrode formed on the side surface thereof is covered by the insulating layer, the main surface of the ceramic body becomes the mounting surface, such that at the time of mounting the capacitor on the substrate, the solder does not move upwardly along the side surface and the end surface of the multilayered ceramic capacitor. As the solder moves upwardly to the side surface and the end surface of the multilayered ceramic capacitor, the acoustic noise is increased, such that in the case in which the solder does not move upwardly along the side surface and the end surface of the capacitor, the acoustic noise may be significantly and effectively reduced as described in the embodiment of the present disclosure.

Board (200) for Mounting Multilayered Ceramic Capacitor

A board for mounting a multilayered ceramic capacitor according to another embodiment of the present disclosure may include: a printed circuit board 210 having first and second electrode pads 221 and 222 disposed thereon; and a multilayered ceramic capacitor 100 installed on the printed circuit board 210. The multilayered ceramic capacitor 100 includes: a ceramic body 110 including a dielectric layer 111 and having first and second main surfaces 5, 6 opposing each other in a thickness direction, first and second end surfaces 3, 4 opposing each other in a length direction, and first and second side surfaces 1, 2 opposing each other in a width direction; a first internal electrode 121 disposed in the ceramic body and having a first lead part 121a exposed to at least one of the first and second side surfaces 1, 2; a second internal electrode 122 disposed to face the first internal electrode 121, having the dielectric layer 111 therebetween, and having a second lead part 122a exposed to at least one of the first and second side surfaces 1, 2; a first external electrode 131 electrically connected to the first lead part 121a exposed to the side surface 1, 2 of the ceramic body and extending from the side surface 1, 2 of the ceramic body to which the first lead part 121a is exposed, to at least one of the first and second main surfaces 5, 6; a second external electrode 132 electrically connected to the second lead part 122a exposed to the side surface 1, 2 of the ceramic body and extending from the side surface 1, 2 of the ceramic body to which the second lead part 122a is exposed, to at least one of the first and second main surfaces 5, 6; and an insulating layer 140 covering the first and second external electrodes 131, 132 formed on the first and second side surfaces 1, 2.

Figure 7:
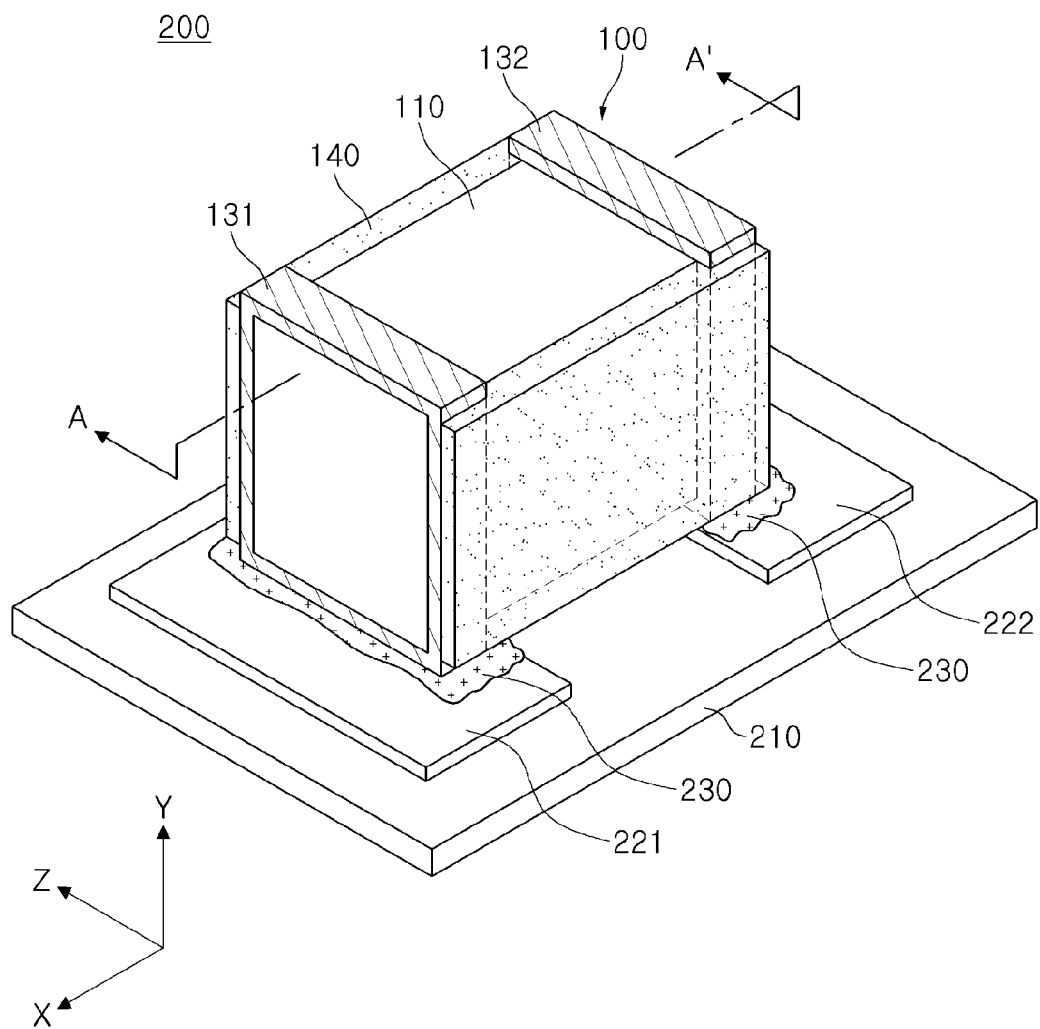
FIG. 7 is a perspective view schematically showing aboard for mounting the multilayered ceramic capacitor according to another embodiment of the present disclosure.
Figure 8:
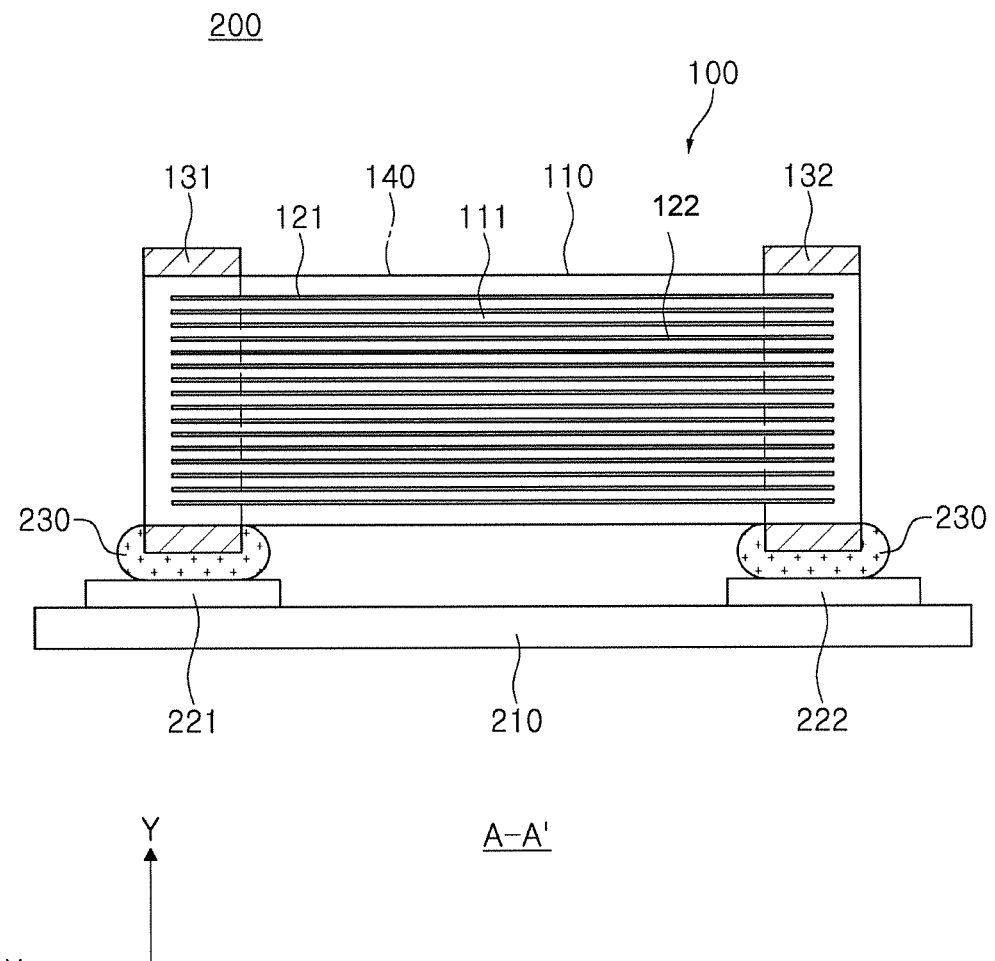
FIG. 8 is a cross-sectional view showing the board for mounting the multilayered ceramic capacitor of FIG. 7 taken along line A-A'.

FIG. 7 is a perspective view showing a state in which the multilayered ceramic capacitor according to the embodiment of the present disclosure is mounted on a printed circuit board, and FIG. 8 is a cross-sectional view showing the board for mounting the multilayered ceramic capacitor of FIG. 7 taken along line A-A'.

Referring to FIGS. 7 and 8, the board 200 for mounting the multilayered ceramic capacitor 100 according to the embodiment of the present disclosure may include a printed circuit board 210 having the multilayered ceramic capacitor 100 mounted thereon, and first and second electrode pads 221 and 222 formed on the printed circuit board 210 so as to be spaced apart from each other.

Here, the multilayered ceramic capacitor 100 may be electrically connected to the printed circuit board 210 by a soldering 230 in a state in which the first and second external electrodes 131 and 132 extending to the first or second main surface 5, 6 are positioned to contact the first and second electrode pads 221 and 222, respectively.

Description of the multilayered ceramic capacitor 100 mounted on the printed circuit board 210 in the embodiment of the present disclosure is omitted because the multilayer ceramic capacitor 100 of this embodiment has similar structures to the multilayer ceramic capacitor of the previous embodiments.

As set forth above, according to the embodiment of the present disclosure, the multilayered ceramic capacitor in which the internal electrode is horizontally mounted thereon, a mounting density is improved, and the capacitance is high, and the board for mounting the same may be provided.

According to the embodiment of the present disclosure, the multilayered ceramic capacitor in which the acoustic noise maybe significantly reduced and the board for mounting the same may be provided.

While the present inventive concept has been shown and described in connection with the embodiments, it will be apparent to those skilled in the art that modifications and variations can be made without departing from the spirit and scope of the present inventive concept as defined by the appended claims.

What is claimed is:

1. A multilayered ceramic capacitor comprising:
 a ceramic body including a dielectric layer and having first and second main surfaces opposing each other in a thickness direction, first and second end surfaces opposing each other in a length direction, and first and second side surfaces opposing each other in a width direction;
 a first internal electrode disposed in the ceramic body and having a first lead part exposed to at least one of the first and second side surfaces;
 a second internal electrode disposed to face the first internal electrode, having the dielectric layer therebetween, and having a second lead part exposed to at least one of the first and second side surfaces;
 a first external electrode electrically connected to the first lead part exposed to the side surface of the ceramic body and extending from the side surface of the ceramic body, to which the first lead part is exposed, to at least one of the first and second main surfaces;
 a second external electrode electrically connected to the second lead part exposed to the side surface of the ceramic body and extending from the side surface of the ceramic body, to which the second lead part is exposed, to at least one of the first and second main surfaces; and
 an insulating layer covering the first and second external electrodes formed on the first and second side surfaces, wherein at least a portion of each of the first and second main surfaces is not covered by the insulating layer.

2. The multilayered ceramic capacitor of claim 1, wherein regions of the first lead part and the second lead part exposed to at least one of the first and second side surfaces overlap with each other.

3. The multilayered ceramic capacitor of claim 1, wherein regions of the first lead part and the second lead part exposed to at least one of the first and second side surfaces do not overlap with each other.

4. The multilayered ceramic capacitor of claim 1, wherein lengths of the exposed regions of the first lead part and the second lead part exposed to at least one of the first and second side surfaces are smaller than widths of the first and second external electrodes formed on the first and second side surfaces.

5. The multilayered ceramic capacitor of claim 1, wherein the first internal electrode is exposed to the first side surface of the ceramic body, and the second internal electrode is exposed to the second side surface of the ceramic body.

6. The multilayered ceramic capacitor of claim 1, wherein the first lead part is exposed to the first side surface, and the second lead part is exposed to the second side surface.

7. The multilayered ceramic capacitor of claim 1, wherein the first and second external electrodes extend from the first side surface to one of the first and second main surfaces.

8. The multilayered ceramic capacitor of claim 1, wherein the first and second external electrodes extend from the first side surface to the first main surface and the second main surface.

9. The multilayered ceramic capacitor of claim 1, wherein the first and second external electrodes extend from the first side surface to one of the first and second main surfaces, and the second side surface.

10. The multilayered ceramic capacitor of claim 1, wherein the first and second external electrodes extend from the first side surface to the first and second main surfaces and the second side surface.

11. The multilayered ceramic capacitor of claim 1, wherein the first and second external electrodes contact the first and second end surfaces.

12. The multilayered ceramic capacitor of claim 1, wherein the first and second external electrodes are spaced apart from the first and second end surfaces by a predetermined interval.

13. The multilayered ceramic capacitor of claim 1, wherein the first external electrode extends from the first side surface to the first main surface, and the second external electrode extends from the second side surface to the first main surface.

14. The multilayered ceramic capacitor of claim 1, wherein the insulating layer covers the first and second external electrodes disposed on the first and second side surfaces and the first and second side surfaces of the ceramic body.

15. The multilayered ceramic capacitor of claim 1, wherein the insulating layer covers the first and second external electrodes disposed on the first and second side surfaces and the first and second side surfaces and the first and second end surfaces of the ceramic body.

16. The multilayered ceramic capacitor of claim 1, wherein the insulating layer covers regions of the first and second external electrodes disposed on the first and second side surfaces, from a mounting surface to a predetermined height thereof, and regions of the first and second side surfaces, from the mounting surface to a predetermined height thereof.

17. The multilayered ceramic capacitor of claim 1, wherein the insulating layer is spaced apart from the mounting surface of the ceramic body by a predetermined interval.

18. The multilayered ceramic capacitor of claim 1, wherein the insulating layer contains an organic resin, a ceramic, an inorganic filler, glass, or a mixture thereof.

19. The multilayered ceramic capacitor of claim 1, wherein the first and second internal electrodes are disposed to be horizontal with respect to the mounting surface of the ceramic body.

20. The multilayered ceramic capacitor of claim 1, wherein when an average thickness of the dielectric layer is td, $0.1\mu m \leq td \leq 2.0\mu m$ is satisfied.

21. The multilayered ceramic capacitor of claim 1, wherein a thickness of each of the first and second internal electrodes is 1.5μm or less.

22. A board for mounting a multilayered ceramic capacitor, the board comprising:
a printed circuit board having first and second electrode pads disposed thereon; and
a multilayered ceramic capacitor disposed on the printed circuit board,
wherein the multilayered ceramic capacitor includes:
a ceramic body including a dielectric layer and having first and second main surfaces opposing each other in a thickness direction, first and second end surfaces opposing each other in a length direction, and first and second side surfaces opposing each other in a width direction;
a first internal electrode disposed in the ceramic body and having a first lead part exposed to at least one of the first and second side surfaces;
a second internal electrode disposed to face the first internal electrode, having the dielectric layer therebetween, and having a second lead part exposed to at least one of the first and second side surfaces;
a first external electrode electrically connected to the first lead part exposed to the side surface of the ceramic body and extending from the side surface of the ceramic body, to which the first lead part is exposed, to at least one of the first and second main surfaces;
a second external electrode electrically connected to the second lead part exposed to the side surface of the ceramic body and extending from the side surface of the ceramic body, to which the second lead part is exposed, to at least one of the first and second main surfaces; and
an insulating layer covering the first and second external electrodes disposed on the first and second side surfaces,
wherein at least a portion of each of the first and second main surfaces is not covered by the insulating layer.

23. A multilayered ceramic capacitor comprising:
a ceramic body including a dielectric layer and having first and second main surfaces opposing each other in a thickness direction, first and second end surfaces opposing each other in a length direction, and first and second side surfaces opposing each other in a width direction;
a first internal electrode disposed in the ceramic body and having a first lead part extending to and facing at least one of the first and second side surfaces;
a second internal electrode disposed to face the first internal electrode, having the dielectric layer therebetween, and having a second lead part extending to and facing at least one of the first and second side surfaces;
a first external electrode electrically connected to the first lead part and extending from a portion of the side surface of the ceramic body, to which the first lead part is exposed, to a portion of at least one of the first and second main surfaces;
a second external electrode electrically connected to the second lead part and extending from a portion of the side surface of the ceramic body, to which the second lead part is exposed, to a portion of at least one of the first and second main surfaces; and
an insulating layer covering a portion of the first and second external electrodes disposed on the first and second side surfaces,
wherein at least a portion of each of the first and second main surfaces is not covered by the insulating layer.

24. The multilayered ceramic capacitor of claim 23, wherein the first external electrode extends along a side of the side surface, the first main surface and second main surfaces adjacent to the first end surface, and
wherein the second external electrode extends along the other side of the side surface, the first main surface, and the second main surface adjacent to the second end surface.

25. The multilayered ceramic capacitor of claim 23, the insulating layer covers a portion of the first and second side surfaces of the ceramic body.

26. The multilayered ceramic capacitor of claim 23, the insulating layer covers a portion of the first and second end surfaces of the ceramic body.

27. The multilayered ceramic capacitor of claim 25, wherein the insulating layer covers regions of the first and second external electrodes disposed on the first and second side surfaces, from a mounting surface to a predetermined height thereof, and regions of the first and second side surfaces, from the mounting surface to a predetermined height thereof.

28. The multilayered ceramic capacitor of claim 23, wherein the insulating layer covers the entirety of the first and second end surfaces and the entirety of the first and second side surfaces.

29. A multilayered ceramic capacitor comprising:
- a ceramic body having a hexahedral shape defined by six side surfaces, and having a dielectric layer therein;
- a first internal electrode disposed in the ceramic body and having a first lead part extending to and facing at least one of the six side surfaces;
- a second internal electrode disposed to face the first internal electrode, having the dielectric layer therebetween, and having a second lead part extending to and facing at least one of the six side surfaces;
- a first external electrode electrically connected to the first lead part and extending from a portion of the side surface, to which the first lead part is exposed, to a portion of one of the six side surfaces;
- a second external electrode electrically connected to the second lead part and extending from a portion of the side surface, to which the second lead part is exposed, to a portion of at least one of the six side surfaces; and
- an insulating layer covering a portion of the first and second external electrodes,
- wherein at least a portion of each of two opposing surfaces of the six side surfaces is not covered by the insulating layer.

30. The multilayered ceramic capacitor of claim 29, wherein the insulating layer covers the side surfaces on which the first and second external electrodes are disposed.

31. The multilayered ceramic capacitor of claim 30, wherein the insulating layer covers at least one of the side surfaces adjacent to the side surfaces on which the first and second external electrodes are disposed.

* * * * *